United States Patent
Hayashi (10) Patent No.: US 7,094,611 B1
(45) Date of Patent: Aug. 22, 2006

(54) METHOD OF PRODUCING FERROELECTRIC CAPACITOR

(75) Inventor: Takahisa Hayashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 11/205,129

(22) Filed: Aug. 17, 2005

(30) Foreign Application Priority Data

Sep. 28, 2004 (JP) .............................. 2004-282251

(51) Int. Cl.
   *H01L 21/00* (2006.01)
(52) U.S. Cl. .................. 438/3; 438/238; 438/239; 438/240; 438/381; 257/E21.664
(58) Field of Classification Search ................. 438/3, 438/238, 239, 240, 381; 257/E21.664
   See application file for complete search history.

(56) References Cited

U.S. PATENT DOCUMENTS

| | | | |
|---|---|---|---|
| 5,879,982 A | | 3/1999 | Park et al. |
| 6,396,092 B1 * | | 5/2002 | Takatani et al. ............. 257/295 |
| 6,600,183 B1 * | | 7/2003 | Visokay et al. ............. 257/295 |
| 6,617,631 B1 * | | 9/2003 | Huang ............. 257/296 |
| 6,649,955 B1 * | | 11/2003 | Lee ............. 257/295 |
| 6,680,499 B1 | | 1/2004 | Kumura et al. |
| 6,764,862 B1 * | | 7/2004 | Park et al. ............. 438/3 |
| 6,130,449 A1 * | | 9/2004 | Kimura et al. ............. 257/296 |
| 6,798,005 B1 * | | 9/2004 | Kimura et al. ............. 257/296 |
| 2005/0074936 A1 * | | 4/2005 | Torii et al. ............. 438/240 |

FOREIGN PATENT DOCUMENTS

| | | |
|---|---|---|
| JP | 10-178157 | 6/1998 |
| JP | 2002-217381 | 8/2002 |
| JP | 2003-086776 | 3/2003 |

* cited by examiner

*Primary Examiner*—B. William Baumeister
*Assistant Examiner*—Igwe U. Anya
(74) *Attorney, Agent, or Firm*—Takeuchi & Kubotera, LLP (57) ABSTRACT

A method of producing a ferroelectric capacitor includes preparing a semiconductor substrate having MOSFETs with an impurity diffused area in a memory cell area and a peripheral circuit area; forming a first interlayer insulating film on the semiconductor substrate; forming a conductive plug in the first interlayer insulating film to be electrically connected to the impurity diffused area; forming a second interlayer insulating film on the first interlayer insulating film; removing a portion of the second interlayer insulating film in the memory cell area to expose the first interlayer insulating film and the conductive plug; laminating a first conductive layer, a ferroelectric layer, and a second conductive layer sequentially on the first interlayer insulating film and the second interlayer insulating film to form a capacitor forming laminated film; forming an etching mask on the capacitor forming laminated film; and etching the capacitor forming laminated film to form a ferroelectric capacitor.

2 Claims, 7 Drawing Sheets

METHOD OF PRODUCING FERROELECTRIC CAPACITOR

BACKGROUND OF THE INVENTION AND RELATED ART STATEMENT

The present invention relates to a method of producing a ferroelectric memory.

Recently, a semiconductor memory (ferroelectric memory) using a ferroelectric capacitor has been focused as a non-volatile memory. A ferroelectric has a characteristic of holding a bi-polar aligned in a voltage application direction even after a voltage is removed (self-polarization). Accordingly, the ferroelectric memory can be used as a non-volatile memory. A ferroelectric switches polarization thereof at a rate of an order of nano-second. It is also possible to decrease a voltage for switching polarization of the ferroelectric about 2.0 V through optimization of a manufacturing method of a ferroelectric layer. For these reasons, as compared with a flash memory or an EEPROM (electrically erasable programmable read-only memory), the ferroelectric memory has significant advantages in terms of a re-writing speed and an operation voltage. Further, it is possible to re-write the ferroelectric memory more than $10^{12}$ times. The ferroelectric capacitor has been commercially available as an RAM (random access memory).

A conventional method of producing a ferroelectric memory will be explained with reference to FIGS. 6(A)–6(C) and 7(A)–7(C) (refer to Patent References 1 to 3).

Figure 6A:
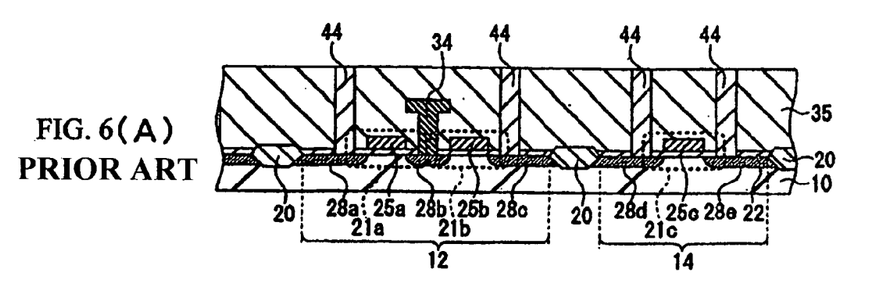
FIGS. 6(A) to 6(C) are explanatory views showing a conventional method of producing a ferroelectric capacitor.

First, an element separation film 20 is formed on a silicon substrate 10 or a semiconductor substrate to define a memory cell area 12. A first MOSFET 21a, a second MOSFET 21b, and a third MOSFET 21c are formed in the memory cell area 12 and a peripheral circuit area 14 outside the memory cell area 12. The first MOSFET 21a is provided with a gate electrode 25a, an impurity diffused area 28a as a source area, and an impurity diffused area 28b as a drain area. The second MOSFET 21b is provided with a gate electrode 25b, the impurity diffused area 28b as a source area, and an impurity diffused area 28c as a drain area. The third MOSFET 21c is provided with a gate electrode 25c, an impurity diffused area 28d as a source area, and an impurity diffused area 28e as a drain area.

After the first to third MOSFET 21a to 21c are formed on the silicon substrate 10, a silicon oxide film is deposited to form a first interlayer insulating film 35. The impurity diffused areas 28a, 28c, 28d, and 28e are formed in the first interlayer insulating film 35 as the source and drains areas of the first to third MOSFET 21a to 21c. Further, conductive plugs 44 are formed in the first interlayer insulating film 35 for electrically connecting to a ferroelectric capacitor or a metal conductive pattern (FIG. 6(A)). As shown in FIG. 6(A), a bit wiring 34 is formed in the first interlayer insulating film 35 to be connected to the impurity diffused area 28b.

In the conventional method, the bit wiring 34 is embedded in the first interlayer insulating film 35. Accordingly, it is not necessary to provide a space between the ferroelectric capacitor and the conductive plug of the bit wiring for preventing the conductive plug from contacting the ferroelectric capacitor to be formed in a later step. As a result, it is possible to reduce an area of the element.

In the next step, the first interlayer insulating film 35 is polished with a chemical mechanical polishing (CMP) method. A first conductive layer 60, a ferroelectric layer 62, and a second conductive layer 64 are sequentially laminated on the first interlayer insulating film 35 to form a capacitor forming laminated layer 67a (FIG. 6(B)).

Figure 6B:
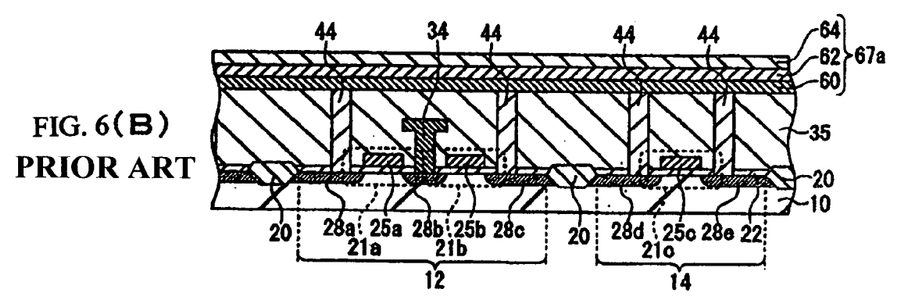
Figure 6C:
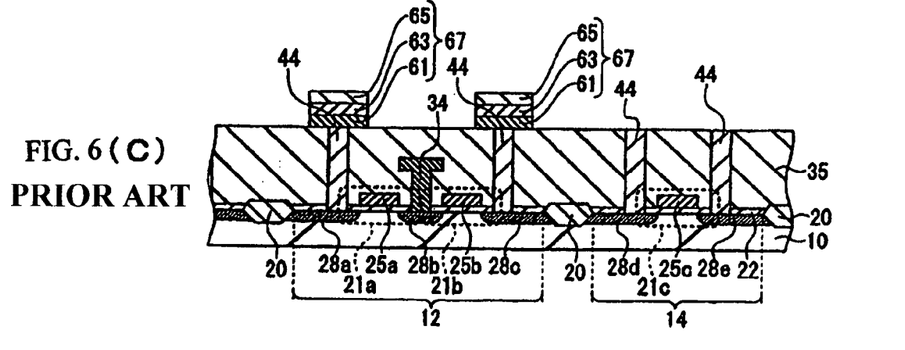

In the next step, the capacitor forming laminated layer 67a is processed with photolithography and dry etching to form ferroelectric capacitors 67 each having a lower electrode 61, a ferroelectric layer 63, and an upper electrode 65 (FIG. 6(C)). The ferroelectric capacitors 67 are electrically connected to the conductive plugs 44 in the memory cell area 12. Normally, after the ferroelectric capacitors 67 are processed with dry etching, an annealing process is performed under oxygen atmosphere (for example, at 750° C. for one minute) to restore damage in the ferroelectric capacitors 67 due to etching. Then, a silicon oxide film is deposited on the first interlayer insulating film 35 to embed the ferroelectric capacitors 67 with a CVD method to form a second interlayer insulating film 52 (FIG. 7(A)).

In the next step, an entire upper surface of the second interlayer insulating film 52 is polished. In this step, when the second interlayer insulating film 52 is polished with the CMP method as is, a portion of the second interlayer insulating film 52 above the memory cell area 12 having a high packaging density tends to protrude relative to a portion of the second interlayer insulating film 52 above the peripheral circuit area 14 having a low packaging density, thereby forming a step portion called a global step in the surface of the second interlayer insulating film 52. In order to eliminate the global step, first, the portion of the second interlayer insulating film 52 above the memory cell area 12 is removed with half etching, so that a height of the portion is reduced in half (FIG. 7(B)). Then, the second interlayer insulating film 52 is polished with the CMP method to flatten the upper surface thereof (FIG. 7(C)).

Figure 7A:
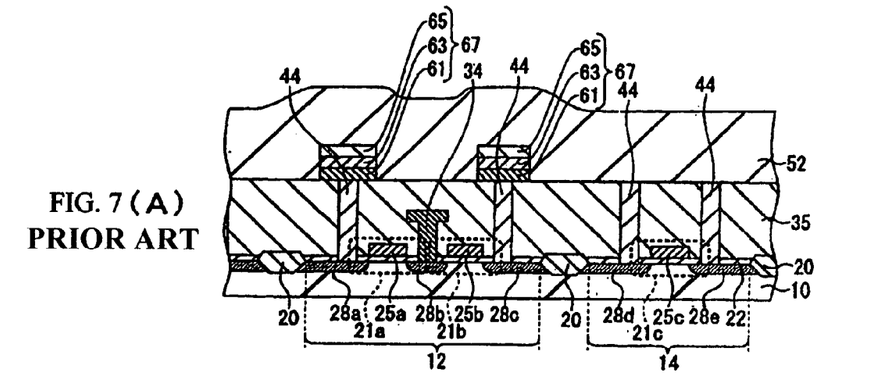
FIGS. 7(A) to 7(C) are explanatory views showing a conventional method of producing a ferroelectric capacitor.
Figure 7B:
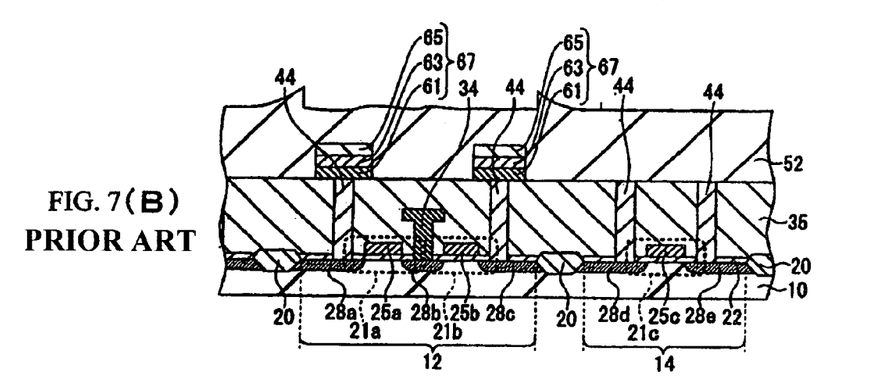
Figure 7C:
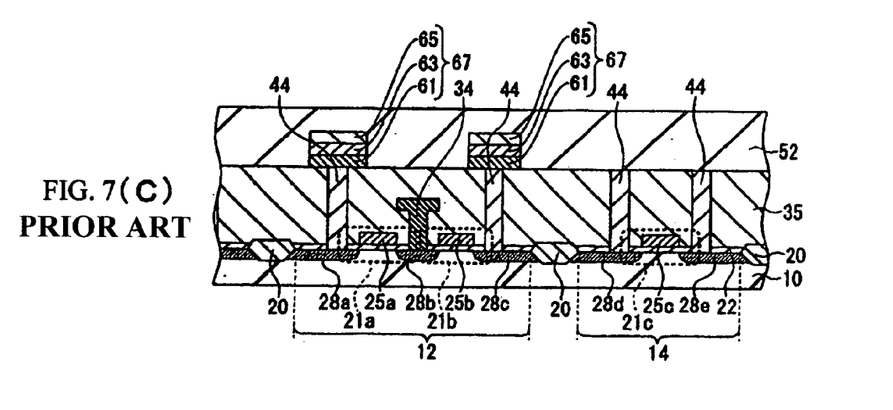

After the upper surface of the second interlayer insulating film 52 is flattened, additional conductive plugs are formed in the second interlayer insulating film 52 for electrically connecting the conductive plugs 44 of the upper electrodes 65 of the ferroelectric capacitors 67 and the conductive plugs 44 in the peripheral circuit area 14 with a known method. A metal conductive pattern is formed on the second interlayer insulating film 52.

Patent Reference 1; Japanese Patent Publication (Kokai) No. 10-178157

Patent Reference 2; Japanese Patent Publication (Kokai) No. 2002-217381

Patent Reference 3; Japanese Patent Publication (Kokai) No. 2003-86776

In the conventional method described above, the conductive plugs in the memory cell area and the peripheral circuit area are formed in the same step as shown in FIGS. 6(A) to 6(C), thereby causing the following problems. When the ferroelectric capacitors are formed with etching, a vicinity of the surface of the first interlayer insulating film is also etched due to over etching after the lower electrode is formed. During the over etching, the conductive plugs in the peripheral circuit area are exposed in an etching atmosphere, thereby losing the conductive plugs or causing surface roughness. Further, in a state that the conductive plugs made of tungsten are exposed, when the annealing process is performed to restore damage in the ferroelectric capacitors, the conductive plugs are oxidized.

In order to prevent the damage on the conductive plugs described above, in Patent Reference 2, a silicon oxide film is formed on an interlayer insulating film to prevent oxidation of the conductive plugs. In Patent Reference 3, a silicon nitride film is formed on an interlayer insulating film. In the methods disclosed in Patent References 2 and 3, it is necessary to provide an additional step of forming the films to prevent oxidation of the conductive plugs.

In view of the problems described above, an object of the present invention is to provide a method of producing a ferroelectric memory, in which it is possible to prevent damage of a conductive plug when an etching process is performed to form a ferroelectric film or an annealing process is performed to restore a ferroelectric film.

Further objects and advantages of the invention will be apparent from the following description of the invention.

SUMMARY OF THE INVENTION

In order to attain the objects described above, according to the present invention, a method of producing a ferroelectric capacitor includes the steps of: preparing a semiconductor substrate having MOSFETs with impurity diffused areas as constituting areas in a memory cell area and a peripheral circuit area outside the memory cell area; forming a first interlayer insulating film on the semiconductor substrate; forming a conductive plug in the first interlayer insulating film to be electrically connected to the impurity diffused areas of the MOSFETs; forming a second interlayer insulating film on the first interlayer insulating film; removing a portion of the second interlayer insulating film in the memory cell area to expose a surface of the first interlayer insulating film and a top of the conductive plug while remaining other portion of the second interlayer insulating film in the peripheral circuit area; laminating a first conductive layer, a ferroelectric layer, and a second conductive layer sequentially on the exposed surface of the first interlayer insulating film and an exposed surface of the other portion of the second interlayer insulating film to form a capacitor forming laminated film; forming an etching mask on the capacitor forming laminated film in a capacitor forming area defined on the conductive plug included in the memory cell area; and etching the capacitor forming laminated film with the etching mask to form a ferroelectric capacitor.

According to the present invention, it is preferred to form the second interlayer insulating film after a process protection film is formed on the first interlayer insulating film.

In the method of producing a ferroelectric capacitor according to the present invention, after the second interlayer insulating film is formed on the first interlayer insulating film, the portion of the second interlayer insulating film in the memory cell area is removed to form the ferroelectric capacitor in the memory cell area. At this time, the second interlayer insulating film in the peripheral circuit area remains on the first interlayer insulating film. Accordingly, when the etching is performed to form the ferroelectric capacitor, the conductive plug is not exposed to an etching atmosphere. As a result, it is possible to prevent damage on the conductive plug when the ferroelectric capacitor is formed. Further, when restoration annealing of the ferroelectric film of the ferroelectric capacitor is performed under oxygen, the conductive plug is not oxidized, as the conductive plug is not exposed.

Further, in the present invention, the process protection film is formed between the first interlayer insulating film and the second interlayer insulating film. Accordingly, when the portion of the second interlayer insulating film in the memory cell area is removed, the process protection film functions as an etching stopper, thereby making it easy to control an etching depth.

DETAILED DESCRIPTION OF PREFERRED EMBODIMENTS

Hereunder, embodiments of the present invention will be explained with reference to the accompanying drawings. A configuration and arrangement of an embodiment are schematically presented for explaining the invention. The embodiments will be explained with configurations and numerical conditions as preferred examples, and the invention is not limited thereto.

First Embodiment

Figure 1A:
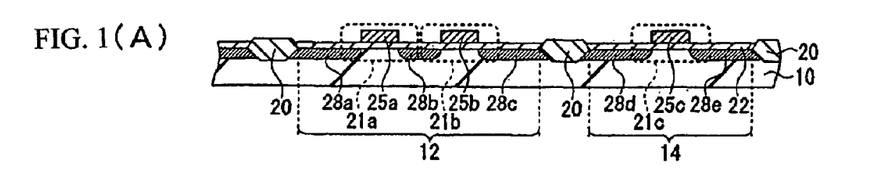
FIGS. 1(A) to 1(D) are explanatory views showing a method of producing a ferroelectric capacitor (No. 1) according to a first embodiment of the present invention.

First, element separation oxide films 20 are formed on a silicon substrate 10 with an LOCOS (local oxidation of silicon) method. The element separation oxide films 20 are formed in areas defining a memory cell area 12 and a peripheral circuit area 14 outside the memory cell area 12, respectively. The element separation oxide films 20 may be formed with an STI (shallow trench isolation) method. The memory cell area 12 is an area in which a minimum circuit for storing information is formed, and a ferroelectric capacitor is formed in the memory cell area 12. On the other hand, a ferroelectric capacitor is not formed in the peripheral circuit area 14. Depending on a conductive type of the silicon substrate 10 and a conductive type of the MOSFETs on the silicon substrate 10, a p-type or n-type impurity is introduced in the memory cell area 12 and the peripheral circuit area 14 of the silicon substrate 10 to form a p-well or n-well.

In the next step, surfaces of the memory cell area 12 and the peripheral circuit area 14 of the silicon substrate 10 are thermally oxidized to form a silicon thermal oxidation film 22 as a gate insulating film. Then, poly-crystalline silicon is deposited on the silicon thermal oxidation film 22 with a chemical vapor deposition (CVD) method to form a poly-crystalline silicon film. The poly-crystalline silicon film is processed with known photolithography and dry etching to form gate electrodes 25a to 25c. Then, ions are implanted into the gate electrodes 25a to 25c to form impurity diffused areas 28a to 28e to be a source area and a drain area of the MOSFETs, thereby completing first to third MOSFETs 21a to 21c.

The first MOSFET 21a is provided with the gate electrode 25a, the impurity diffused area 28a as the source area, and the impurity diffused area 28b as the drain area. The second MOSFET 21b is provided with the gate electrode 25b, the impurity diffused area 28b as the source area, and the impurity diffused area 28c as the drain area. The third MOSFET 21c is provided with the gate electrode 25c, the impurity diffused area 28d as the source area, and the impurity diffused area 28e as the drain area (FIG. 1(A)).

Figure 1B:
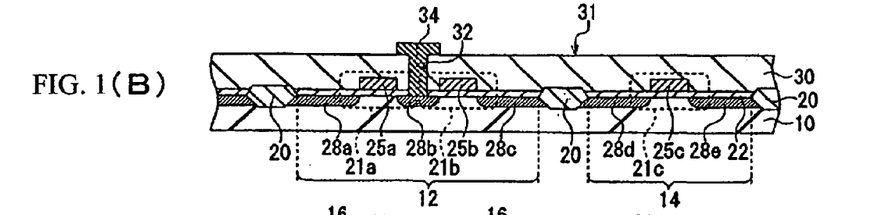

In the next step, a first interlayer insulating film 35 is deposited on the silicon substrate 10 having the first to third MOSFETs 21a to 21c. In this embodiment, first, silicon oxide is deposited on the silicon substrate 10 with the CVD method, and then the deposited silicon oxide is flattened with a chemical mechanical polishing (CMP) method to form a first silicon oxide film 30. Then, a bit wire contact hole 32 is formed in the first silicon oxide film 30 in the memory cell area 12 with known photolithography and dry etching. The bit wire contact hole 32 is formed such that the impurity diffused area 28b between the gate electrodes 25a and 25b in the memory cell area 12 is exposed.

In the next step, the bit wire contact hole 32 is filled with tungsten through the CVD method. At this time, tungsten is deposited on an upper surface 31 of the first silicon oxide film 30 as well. The deposited tungsten on the upper surface 31 of the first silicon oxide film 30 is patterned with known photolithography and dry etching to form a bit wire 34 together with tungsten filled in the bit wire contact hole 32 (FIG. 1(B)).

In the next step, a second silicon oxide film 40 is formed on an entire upper surface of the first silicon oxide film 30 including the bit wire 34 with the CVD method and CMP method, similar to the first silicon oxide film 30. In this embodiment, the first interlayer insulating film 35 is formed as a laminated film of the first silicon oxide film 30 and the second silicon oxide film 40.

Figure 1C:
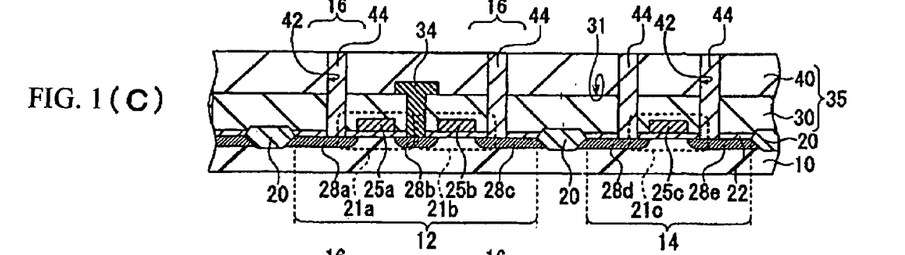

In the next step, conductive plugs 44 are formed in the first interlayer insulating film 35. In this process, first, capacitor forming areas 16 where capacitors are to be formed are set on a surface of the first interlayer insulating film 35. The capacitor forming areas 16 are situated in the impurity diffused areas 28a to 28c in the memory cell area 12. First contact holes 42 are formed in the first interlayer insulating film 35 in the capacitor forming areas 16 and the peripheral circuit area 14 with photolithography and dry etching, so that the impurity diffused areas 28a and 28c to 29e are exposed.

In the next step, the first contact holes 42 are filled with tungsten through the CVD method, and the conductive plugs 44 are formed through etching back (FIG. 1(C)). The first contact holes 44 are connected to the impurity diffused areas 28a and 28c to 29e of the MOSFETs 21a, 21b, and 21c.

Figure 1D:
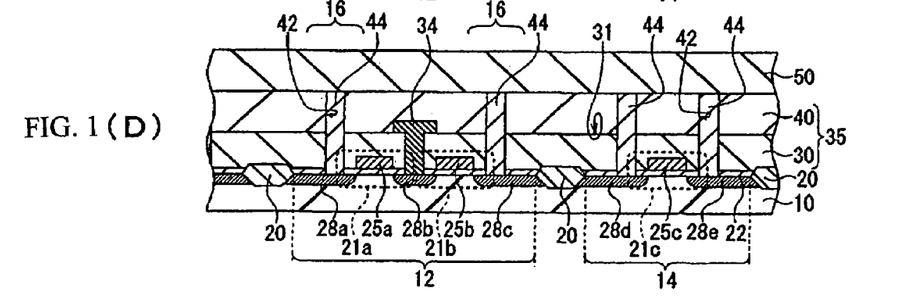

In the next step, a second interlayer insulating film 50 is formed on an entire upper surface of the first interlayer insulating film 35 including the conductive plugs 44. In this embodiment, the second interlayer insulating film 50 is formed of a silicon oxide film with the CVD method and CMP method, similar to the first interlayer insulating film 35. The second interlayer insulating film 50 has a thickness of about 0.5 μm (FIG. 1(D)).

Figure 2A:
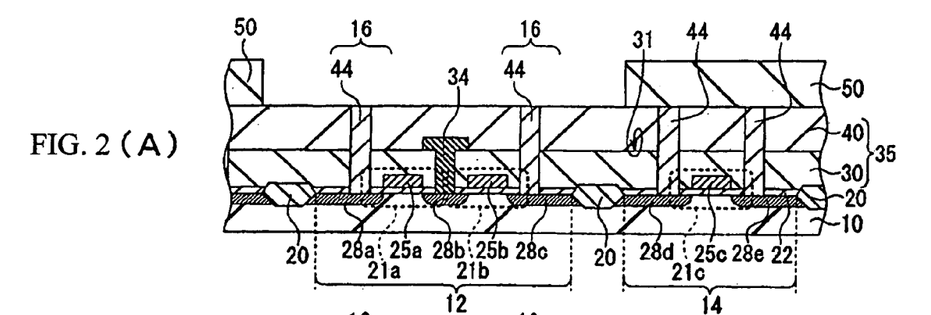
FIGS. 2(A) to 2(C) are explanatory views showing a method of producing a ferroelectric capacitor (No. 2) according to the first embodiment of the present invention.

In the next step, the second interlayer insulating film 50 in the memory cell area 12 is removed with known photolithography and dry etching while the second interlayer insulating film 50 in the peripheral circuit area 14 remains, so that a surface of the first interlayer insulating film 35 and top portions of the first conductive plugs 44 in the memory cell area 12 are exposed, respectively (FIG. 2(A)).

Figure 2B:
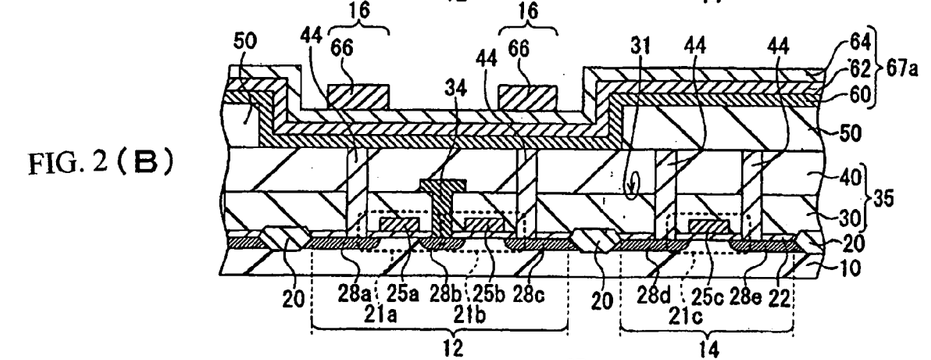

In the next step, a first conductive layer 60, a ferroelectric layer 62, and a second conductive layer 64 are sequentially formed on the exposed surface of the first interlayer insulating film 35 including the first conductive plugs 44 and an exposed surface of the remaining second interlayer insulating film 50, thereby forming a capacitor forming laminated film 67a. In this embodiment, the first conductive layer 60 is formed of iridium (Ir) with sputtering. A ferroelectric material such as $SrBi_2Ta_2O_9$ (SBT) is coated on the first conductive layer 60 with spin coating, and the ferroelectric material is annealed for crystallization to form the ferroelectric layer 62. The second conductive layer 64 is formed of platinum (Pt) with sputtering. The first conductive layer 60, the ferroelectric layer 62, and the second conductive layer 64 have a thickness of 150 nm, respectively.

In the next step, an etching mask is formed on the second conductive layer 64. That is, a photo-resist is coated as an etching mask material to form a photo-resist layer (not shown). Then, photo-resist patterns 66 are formed in an area covering the capacitor forming areas 16 on the second conductive layer 64 as the etching mask with known photolithography (FIG. 2(B)).

In the next step, the capacitor forming laminated film 67a is processed with etching using the photo-resist patterns 66 as the mask to form ferroelectric capacitors. That is, the second conductive layer 64, the ferroelectric layer 62, and the first conductive layer 60 exposed from the mask are sequentially removed with etching to form upper electrodes 65, ferroelectric films 63, and lower electrodes 61, respectively. The upper electrodes 65 are remaining portions of the second conductive layer. The ferroelectric films 63 are remaining portions of the ferroelectric layer, and the lower electrodes 61 are remaining portions of the first conductive layer. Accordingly, the ferroelectric capacitors 67 are formed of the upper electrodes 65, the ferroelectric films 63, and the lower electrodes 61 from the capacitor forming laminated film 67a. The respective layers 64, 62, and 60 are processed sequentially in a single dry etching process to form the ferroelectric capacitors 67 (FIG. 2(C)).

Figure 2C:
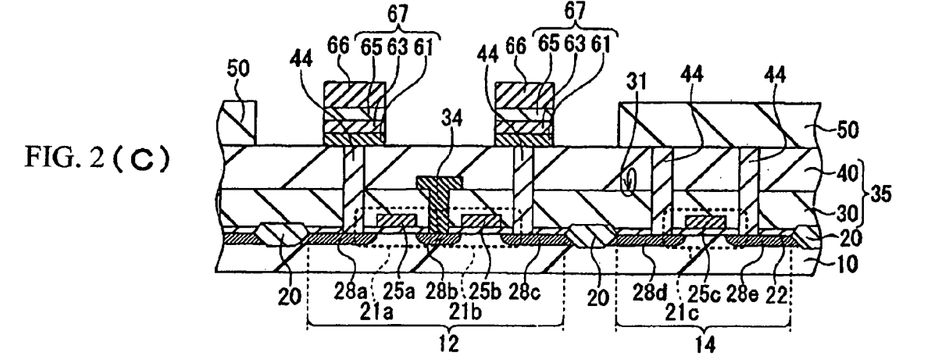

When the ferroelectric capacitors 67 are formed with etching, after the lower electrodes are formed, the first interlayer insulating layer may be etched due to over-etching. If the surfaces of the conductive plugs are exposed in etching atmosphere due to the over-etching, the conductive plugs may be removed or surfaces thereof may be damaged. In this embodiment, the capacitor forming areas are set at the top portions and the surrounding areas of the conductive plugs 44 in the memory cell area 12, and the ferroelectric capacitors 67 are formed in the capacitor forming areas 16. Accordingly, the lower electrodes 61 of the ferroelectric capacitors 67 cover the first conductive plugs 44. Further, the second interlayer insulating film 50 covers the first conductive plugs in the peripheral circuit area 14. Accordingly, when the ferroelectric capacitors 67 are formed with etching, the first conductive plugs are not exposed in etching atmosphere, so that the conductive plugs are not removed or the surfaces thereof are not damaged due to etching.

When the ferroelectric capacitors 67 are formed with etching, crystallinity of the ferroelectric films 63 is partially damaged. In order to restore the crystallinity, restoration annealing is performed on the ferroelectric capacitors 67. When the restoration annealing is performed under oxygen, if the first conductive plugs 44 formed of tungsten are exposed, the first conductive plugs 44 are oxidized. In the embodiment, the first conductive plugs 44 in the memory cell area 12 and the peripheral circuit area 14 are not exposed, thereby preventing oxidation of the first conductive plugs 44 in the restoration annealing of the ferroelectric capacitors 67.

Figure 3A:
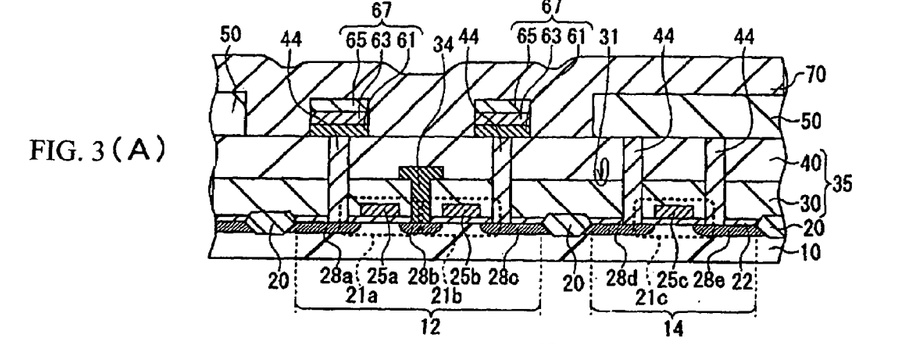
FIGS. 3(A) to 3(C) are explanatory views showing a method of producing a ferroelectric capacitor (No. 3) according to the first embodiment of the present invention.

In the next step, the photo-resist patterns 66 are removed with, for example, ashing. A third interlayer insulating film 70 is formed on an entire upper surface of the first interlayer insulating film 35 including the second interlayer insulating film 50 and the ferroelectric capacitors 67. The third interlayer insulating film 70 is formed of a silicon oxide layer with the CVD method, and has a thickness of about 1.0 µm (FIG. 3(A)). Then, the third interlayer insulating film 70 is flattened with the CMP method (FIG. 3(B)).

Figure 3B:
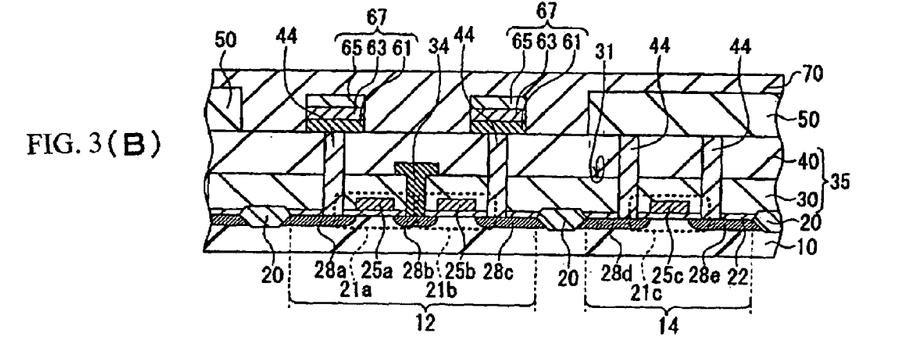

As described above, in the method of producing a ferroelectric capacitor according to the first embodiment, after the second interlayer insulating film 50 in the memory cell area 12 is removed, the ferroelectric capacitors 67 are formed. Then, the silicon oxide layer is deposited to form the third interlayer insulating film 70 followed by flattening. At this time, the second interlayer insulating film 50 in the peripheral circuit area 14 remains, and the second interlayer insulating film 50 in the memory cell area 12 is removed. Accordingly, it is possible to flatten the third interlayer insulating film 70 with the CMP method without a step of half-etching necessary in a conventional method for eliminating a global step.

Figure 3C:
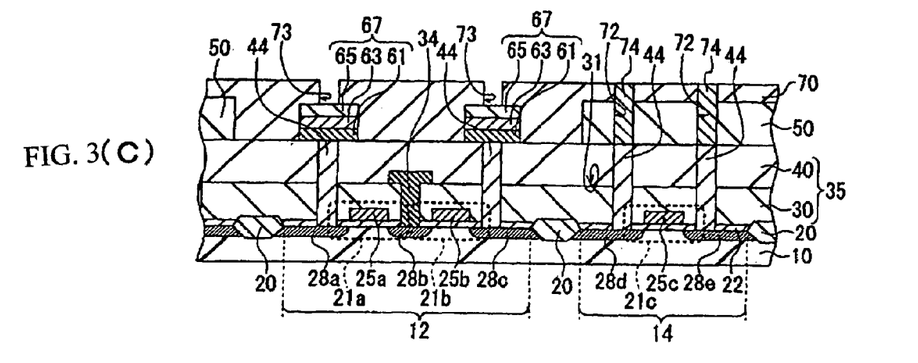

In the next step, openings 72 are formed in the second interlayer insulating film 50 and the third interlayer insulating film 70 to expose the first conductive plugs 44 with known lithography and dry etching. After the openings 70 are filled with tungsten with the CVD method, second conductive plugs 74 are formed for electrically connecting to the first conductive plugs 44 with etching-back. Then, openings 73 are formed in the second interlayer insulating film 50 and the third interlayer insulating film 70 to expose the upper electrodes 65 of the ferroelectric capacitors 67 (FIG. 3 (C)).

Figure 4A:
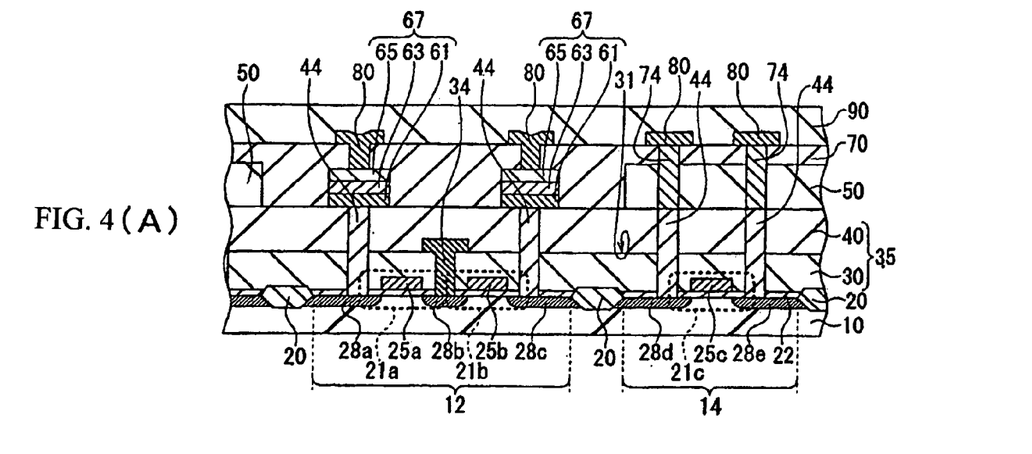
FIGS. 4(A) and 4(B) are explanatory views showing a method of producing a ferroelectric capacitor (No. 1) according to a second embodiment of the present invention.

In the next step, aluminum is deposited on the third interlayer insulating film 70 with sputtering to form a first metal layer (not shown). At this time, the openings 73 are also filled with aluminum. The first metal layer is processed with known photolithography and dry etching to form first metal wirings 80. Then, a fourth interlayer insulating film 90 is formed on the third interlayer insulating film 70 with the CVD method and CMP method, similar to the first interlayer insulating film 35 (FIG. 4 (A)).

Figure 4B:
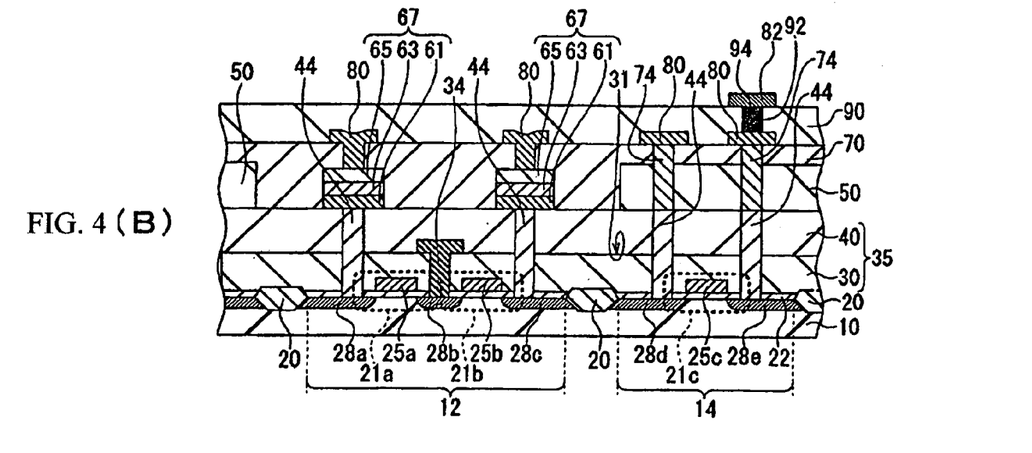

In the next step, an opening 92 is formed in the fourth interlayer insulating film 90. The opening 90 is filled with tungsten to form a third conductive plug 94. Then, a second metal wiring 82 is formed on the fourth interlayer insulating film 90 for electrically connecting to the third conductive plug 94, similar to the first metal wirings 84 (FIG. 4 (B)). The third conductive plug 94 may be formed of a material same as that of the second metal wiring 82 such as aluminum in the step of forming the second metal wiring 82.

If necessary, a protective film is formed to cover the second metal wiring 82 and the fourth interlayer insulating film 90. In this embodiment, the bit wiring 34 is formed in the first interlayer insulating film 35, and the bit wiring 34 may be formed as the first metal wirings 80.

Second Embodiment

In the second embodiment, the steps up to forming the first conductive plugs 44 shown in FIGS. 1(A) to 1(C) are the same as those in the first embodiment, and explanations thereof are omitted. A process protection film 45 is formed on the first interlayer insulating film 35 having the first conductive plugs 44 formed in the step shown in FIG. 1(C). The process protection film 45 is formed of a silicon nitride film with the CVD method, and has a thickness of about 100 nm. Then, the second interlayer insulating film 50 is formed on the process protection film 45 with the CVD method and CMP method, similar to the first silicon oxide film 30 in the first embodiment. The second interlayer insulating film 50 has a thickness of about 0.5 µm (FIG. 5(A)).

In the next step, a portion of the second interlayer insulating film 50 in the memory cell area 12 is removed with photolithography and dry etching to expose a surface of the process protection film 45 in the memory cell area 12. The etching is performed under a mixture of $C_4F_8$, Ar, and $O_2$, so that the silicon nitride film is not etched to a large extent. When the etching is performed under the mixture as described above, the process protection film 45 functions as etch-stop (FIG. 5(B)).

Figure 5A:
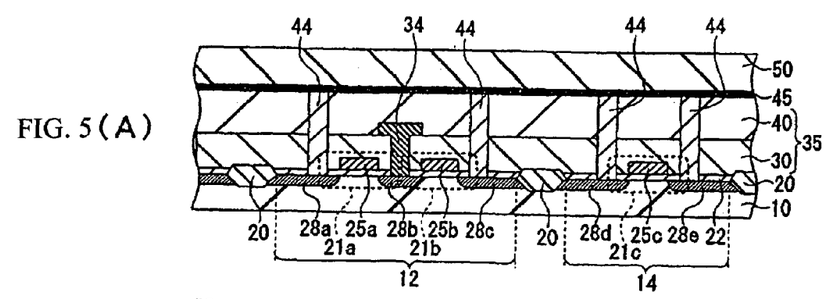
FIGS. 5(A) to 5(C) are explanatory views showing a method of producing a ferroelectric capacitor (No. 2) according to the second embodiment of the present invention.
Figure 5B:
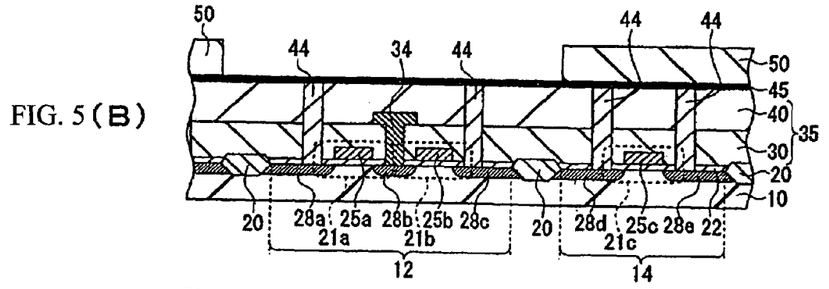
Figure 5C:
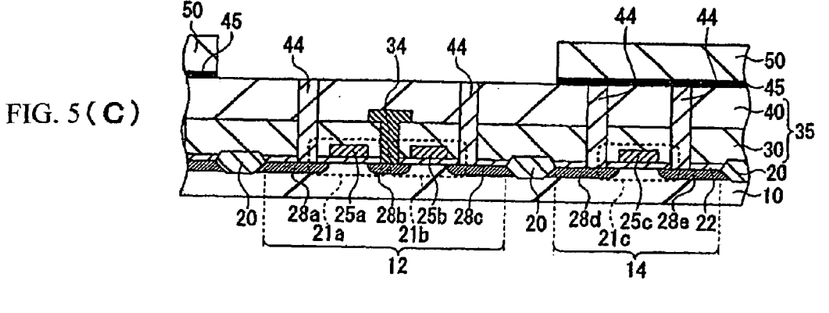

In the next step, the process protection film 45 in the memory cell area 12 is removed and exposed in the step shown in FIG. 5(B) with dry etching under a mixture of $CHF_3$ and CO (FIG. 5(C)). The following steps including the step of forming the ferroelectric capacitors are the same as those shown in FIGS. 2(A)–2(C) to 4(A)–4(B) except the step of forming the process protection film 45, and explanations thereof are omitted.

In the second embodiment, the process protection film 45 is formed between the first interlayer insulating film 35 and the second interlayer insulating film 50. Accordingly, when the second interlayer insulating film 50 in the memory cell area 12 is removed with etching, the etching stops at the process protection film 45. As a result, it is possible to easily control a depth of etching and stably perform etching.

The disclosure of Japanese Patent Application No. 2004-282251, filed on Sep. 28, 2004, is incorporated in the application.

While the invention has been explained with reference to the specific embodiments of the invention, the explanation is illustrative and the invention is limited only by the appended claims.

What is claimed is:

1. A method of producing a ferroelectric capacitor, comprising the steps of:

preparing a semiconductor substrate with MOSFETs having impurity diffused areas, said MOSFETs being formed on the semiconductor substrate in a memory cell area and a peripheral circuit area outside the memory cell area, respectively;

forming a first interlayer insulating film on the semiconductor substrate;

forming a conductive plug in the first interlayer insulating film to be electrically connected to the impurity diffused areas of the MOSFETs;

forming a second interlayer insulating film on the first interlayer insulating film;

removing a portion of the second interlayer insulating film in the memory cell area to expose a surface of the first interlayer insulating film and a top of the conductive plug while remaining other portion of the second interlayer insulating film in the peripheral circuit area;

laminating a first conductive layer, a ferroelectric layer, and a second conductive layer sequentially on the exposed surface of the first interlayer insulating film and an exposed surface of the other portion of the second interlayer insulating film to form a capacitor forming laminated film;

forming an etching mask on the capacitor forming laminated film in a capacitor forming area defined on the conductive plug included in the memory cell area; and etching the capacitor forming laminated film with the etching mask to form a ferroelectric capacitor.

2. A method of producing a ferroelectric capacitor, comprising the steps of:

preparing a semiconductor substrate with MOSFETs having impurity diffused areas, said MOSFETs being formed on the semiconductor substrate in a memory cell area and a peripheral circuit area outside the memory cell area, respectively;

forming a first interlayer insulating film on the semiconductor substrate;

forming a conductive plug in the first interlayer insulating film to be electrically connected to the impurity diffused areas of the MOSFETs;

forming a process protection film on on the first interlayer insulating film forming a second interlayer insulating film on the process protection film;

removing a portion of the second interlayer insulating film in the memory cell area to expose a surface of the process protection film while remaining other portion of the second interlayer insulating film in the peripheral circuit area;

removing the exposed surface of the process protection film to expose a surface of the first interlayer insulating film and a top of the conductive plug;

laminating a first conductive layer, a ferroelectric layer, and a second conductive layer sequentially on the exposed surface of the first interlayer insulating film and an exposed surface of the other portion of the second interlayer insulating film to form a capacitor forming laminated film;

forming an etching mask on the capacitor forming laminated film in a capacitor forming area defined on the conductive plug included in the memory cell area; and etching the capacitor forming laminated film with the etching mask to form a ferroelectric capacitor.

* * * * *